United States Patent
Chen et al.

[19]

[11] Patent Number: 6,114,231
[45] Date of Patent: *Sep. 5, 2000

[54] WAFER STRUCTURE FOR SECURING BONDING PADS ON INTEGRATED CIRCUIT CHIPS AND A METHOD FOR FABRICATING THE SAME

[75] Inventors: Kun-Cho Chen, Taichung Hsien; Jason Jenq, Pingtung, both of Taiwan

[73] Assignee: United Microelectronics Corp., Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/691,522

[22] Filed: Aug. 2, 1996

[30] Foreign Application Priority Data

May 6, 1996 [TW] Taiwan .................................. 85105359

[51] Int. Cl.$^7$ .................................................. H01L 21/44
[52] U.S. Cl. .......................... 438/612; 438/620; 438/622; 438/638; 438/739
[58] Field of Search ...................... 438/626, 629, 438/624, 612, 620, 622, 637, 638, 739; 257/786, 254

[56] References Cited

U.S. PATENT DOCUMENTS

| | | | |
|---|---|---|---|
| 4,617,193 | 10/1986 | Wu | 438/631 |
| 4,753,709 | 6/1988 | Welch et al. | 438/328 |
| 4,764,484 | 8/1988 | Mo | 438/638 |
| 5,084,416 | 1/1992 | Ozaki et al. | 438/197 |
| 5,169,680 | 12/1992 | Ting et al. | 438/629 |
| 5,275,963 | 1/1994 | Cedarbaum et al. | 438/624 |
| 5,394,013 | 2/1995 | Oku et al. | 257/786 |
| 5,545,585 | 8/1996 | Wang et al. | 438/397 |
| 5,610,099 | 3/1997 | Stevens et al. | 438/626 |
| 5,817,571 | 10/1998 | Yu et al. | 438/622 |
| 5,883,001 | 3/1999 | Jin et al. | 438/624 |
| 6,025,277 | 2/2000 | Chen et al. | 438/738 |

Primary Examiner—Carl Whitehead, Jr.
Assistant Examiner—Maria Guerrero
Attorney, Agent, or Firm—Rabin & Champagne PC

[57] ABSTRACT

A wafer structure on an IC chip allows the bonding pads on the IC chip to be firmly secured to the IC chip, thereby preventing detachment of the bonding pads during assembly of the IC package. The wafer structure comprises a substrate on which at least a pad area is defined. The pad area is formed with a first insulating layer, a gate on the first insulating layer, a second insulating layer on the gate, and a third insulating layer on the second insulating layer. The second insulating layer has a plurality of lower openings formed therethrough and the third insulating layer has a plurality of upper openings formed therethrough, each upper opening corresponding to one of the lower openings. The lower openings are wider than the upper openings. Plugs are formed in the lower and upper openings and are bonded to a metallization layer which serves as a bonding pad for the IC chip. The wider lower part of the plugs allows them to be rigidly affixed within the openings, thus allowing the overlaying bonding pad to be firmly secured to the IC chip. Therefore, during assembly of the IC chip, the bonding pad is not readily detached from the IC chip, thus increasing the assembly yield of good IC packages.

10 Claims, 6 Drawing Sheets

WAFER STRUCTURE FOR SECURING BONDING PADS ON INTEGRATED CIRCUIT CHIPS AND A METHOD FOR FABRICATING THE SAME

BACKGROUND OF THE INVENTION

1. Field of the Invention

The invention relates to integrated circuits, and more particularly, to a wafer structure that allows at least a bonding pad formed on an IC chip to be firmly secured to the IC chip so that it will not become detached during assembly of the IC package. Furthermore, the invention relates to a method for forming such a wafer structure.

2. Description of the Related Art

As new IC technology allows higher and higher packing density of semiconductor devices on a single IC chip, the bonding pads that are provided on the IC chip are also made smaller and smaller. Bonding pads are made of conductive material, such as an alloy of aluminum and copper, for electrically connecting semiconductor devices in the IC chip to external pins on the IC package. A drawback of conventionally formed bonding pads is that they are readily detached or stripped from the IC chip during assembly of the IC chip package; this is particularly evident using the chip-on-board method of IC assembly. This significantly decreases the assembly yield of good IC packages.

A conventional method for forming at least a bonding pad on an IC chip, which would be easily detached from the IC chip is illustrated in FIG. 1A through FIG. 1G.

Referring first to FIG. 1A, a stage in the fabrication process for the IC chip is shown which includes a silicon substrate 10 on which a field oxide layer 20 defining the active region is formed. This active region part of the wafer is hereinafter also referred to as the "active area". Further, at least one part of the wafer, which is hereinafter referred to as the "pad area" as indicated by the numeral 25, is reserved for the formation of a bonding pad thereon. Impurities are diffused into the active area so as to adjust the threshold voltage thereof. Further, a gate oxide layer 30 and a polysilicon gate layer 40 are successively formed on the active area to constitute a gate. Using the gate (30, 40) as a mask, an ion implantation process is conducted on the wafer so as to diffuse an impurity, such as phosphor ions, into the silicon substrate 10, thereby forming a pair of lightly-doped source/drain regions 11 in the wafer.

Referring next to FIG. 1B, in the subsequent step, spacer walls 12 are formed on the sidewalls of the gate (30, 40). Referring further to FIG. 1C, using the spacer walls 12 as a mask, an ion implantation process is conducted on the wafer so as to diffuse an impurity, such as arsenic ions, into the silicon substrate 10. As a result, a pair of heavily doped source/drain regions 13 are formed in the wafer. Up to this point, the pad area 25 includes the field oxide layer 20 on the silicon substrate 10.

Referring further to FIG. 1D, in the subsequent step, a layer of borophosphosilicate glass (BPSG) 50 is deposited over the entire wafer. Anisotropic dry etching is then conducted on the wafer with a predefined mask for removal of selected parts of the BPSG layer 50, thereby forming a plurality of metal contact openings 14 through the BPSG layer 50.

Referring next to FIG. 1E, in the subsequent step, sputtering deposition and rapid thermal processing (RTP) are conducted on the wafer so as to form a layer of titanic compound 60 (which is a composition of titanium nitride and titanium silicide (TiN/TiSi$_2$)), over the surface of the silicon substrate 10, and to form a layer of a composition of titanium nitride and titanium silicide oxide (TiN/TiSi$_x$O$_y$) over the surface of the BPSG layer 50.

Referring to FIG. 1F, in the subsequent step, the chemical-vapor deposition (CVD) method is used to deposit a layer of tungsten 70 over the titanic compound layer 60. Dry etching is then conducted on the wafer using the titanic compound layer 60 as an etch end point so as to planarize the surface of the titanic compound layer 60 and the tungsten layer 70. Sputtering deposition is then conducted on the wafer so as to form a metallization layer 80 of, for example, aluminum over the wafer. The foregoing steps also allow the BPSG layer 50, the titanic compound layer 60, and the metallization layer 80 to be formed in the pad area 25.

Referring next to FIG. 1G, in the subsequent step, a mask and photolithographic process is conducted on the metallization layer 80 so as to define a plurality of connecting wires for the IC chip. A passivation layer 90 is then deposited over the wafer for protecting the IC chip. After that, an etch process with a predefined mask is conducted on the pad area 25 for removal of at least a selected part of the passivation layer 90. As a result of this process, an opening 91 is formed through the passivation layer 90 so as to expose the underlying metallization layer 80, thus allowing the metallization layer 80 to serve as a bonding pad that can electrically connect the IC chip to external pins. During assembly of the IC package (particularly by the chip-on-board method), the metallization layer 80 which serves as a bonding pad formed in the pad area 25 is easily detached from the encasing passivation layer 90, thus significantly affecting the assembly yield of good IC packages. There exists, therefore, a need for a new structure for the bonding pad which allows the bonding pad to be securely formed on the IC chip without being peeled away during assembly of the IC package.

SUMMARY OF THE INVENTION

It is therefore an object of the invention to provide a new wafer structure for a bonding pad which allows the bonding pad to be firmly secured on the IC chip without being peeled away during assembly of the IC package.

It is another object of the invention to provide a method for forming the foregoing wafer structure for the bonding pad.

In accordance with the foregoing and other objects of the invention, a new wafer structure for bonding pads on an IC chip and a method for forming the new structure are provided. The wafer structure includes a substrate on which at least a pad area is defined. The pad area is formed with a first insulating layer, a gate on the first insulating layer, a second insulating layer on the gate, a third insulating layer on the second insulating layer, and a metallization layer on the third insulating layer. The second insulating layer has a plurality of first or lower openings formed therethrough and the third insulating layer has a plurality of second or upper openings formed therethrough, each upper opening being connected to one of the plurality of lower openings. In addition, a first metallization layer is formed over the third insulating layer and the entire inner wall surfaces of the first openings and the second openings. A second metallization layer fills up the first openings and the second openings. Further, a third metallization layer is formed over the third insulating layer and the second metallization layer. The third metallization layer serves as a bonding pad for the IC chip.

In the foregoing wafer structure, the first or lower openings are wider than the second openings. Plugs, such as tungsten plugs, are formed in these lower and upper openings and have the same dimensions as the openings. The plugs are bonded to the third metallization layer, which serves as a bonding pad for the IC chip. The wider lower part of the plugs allows them to be retained or anchored within the openings, thus allowing the overlaying metallization layer, which serves as a bonding pad for the IC chip, to be firmly secured by the plugs on the IC chip. Therefore, during assembly of the IC chip, the bonding pad would not easily be peeled away or detached, thus increasing the assembly yield of good IC packages.

The method for forming the foregoing wafer structure includes a first step of preparing a substrate on which at least a pad area is defined; a second step of forming a first insulating layer on the pad area; a third step of forming a gate oxide layer over the first insulating layer; a fourth step of forming a polysilicon gate layer over the gate oxide layer; a fifth step of forming a second insulating layer over the polysilicon gate layer; a sixth step of forming a third insulating layer over the second insulating layer; a seventh step of performing a dry etch process to the second insulating layer and the third insulating layer; an eighth step of performing a wet etch process to selected parts of the second insulating layer and the third insulating layer so as to form a plurality of first openings through the second insulating layer and a plurality of second openings through the third insulating layer; a ninth step of performing sputtering deposition and rapid thermal processing (RTP) to form a first metallization layer over the third insulating layer and the entire inner wall surfaces of the first openings and the second openings; a tenth step of performing a chemical-vapor deposition (CVD) process to form a second metallization layer which fills up the first openings and the second openings; an eleventh step of planarizing the second metallization layer and the third insulating layer; and a twelfth step of performing a sputtering process to form a third metallization layer over the second metallization layer and the third insulating layer.

BRIEF DESCRIPTION OF THE DRAWINGS

The invention can be more fully understood from the following detailed description of the preferred embodiment, with reference to the accompanying drawings, wherein.

DETAILED DESCRIPTION OF THE PREFERRED EMBODIMENT

FIG. 2A through FIG. 2F are schematic sectional diagrams depicting the steps involved in a process according to the invention for forming at least a bonding pad on an IC chip.

Figure 1A:
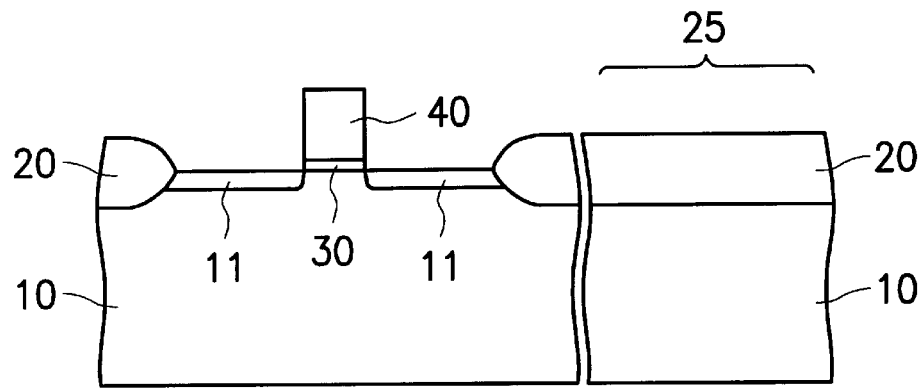
FIG. 1A through FIG. 1G are schematic sectional diagrams depicting the steps involved in a conventional process for forming at least a bonding pad on an IC chip.
Figure 1B:
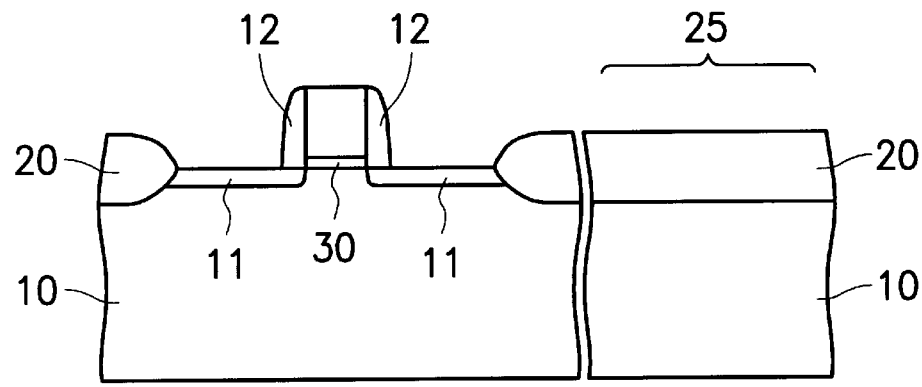
Figure 1C:
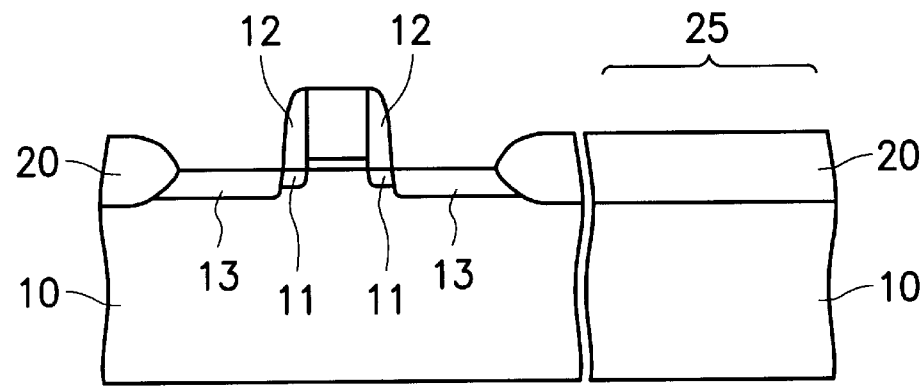
Figure 1D:
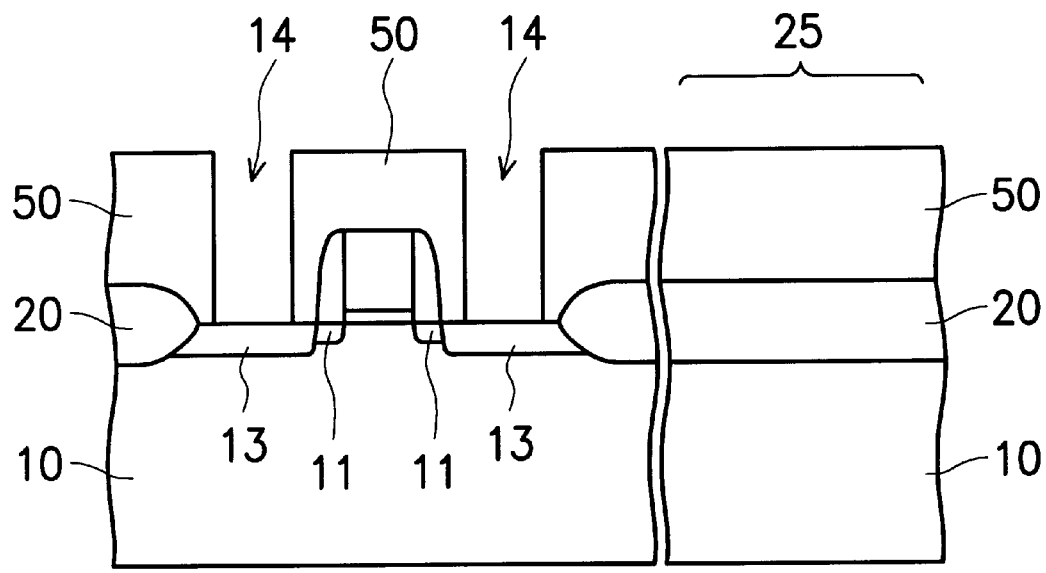
Figure 1E:
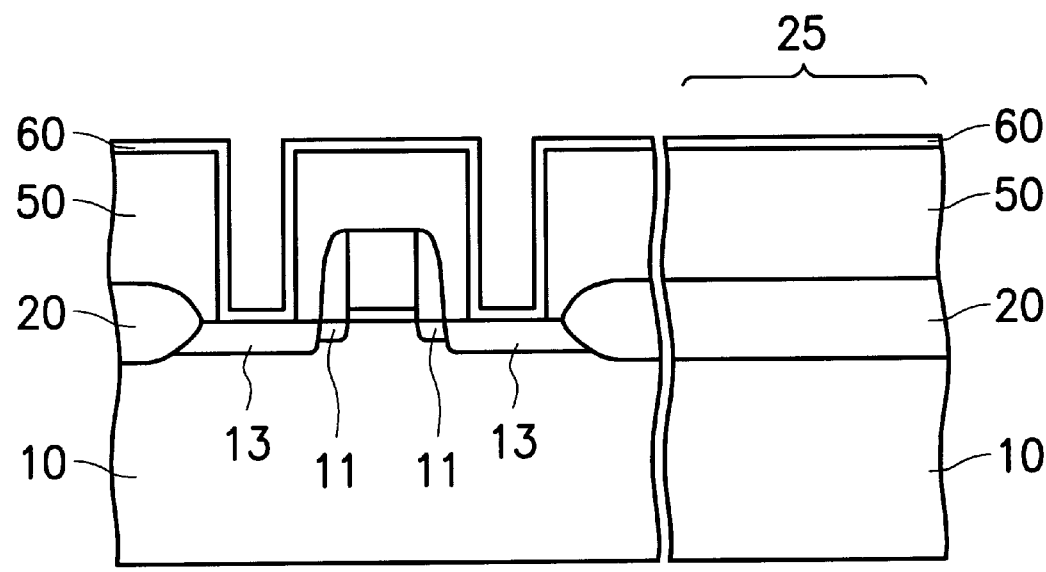
Figure 1F:
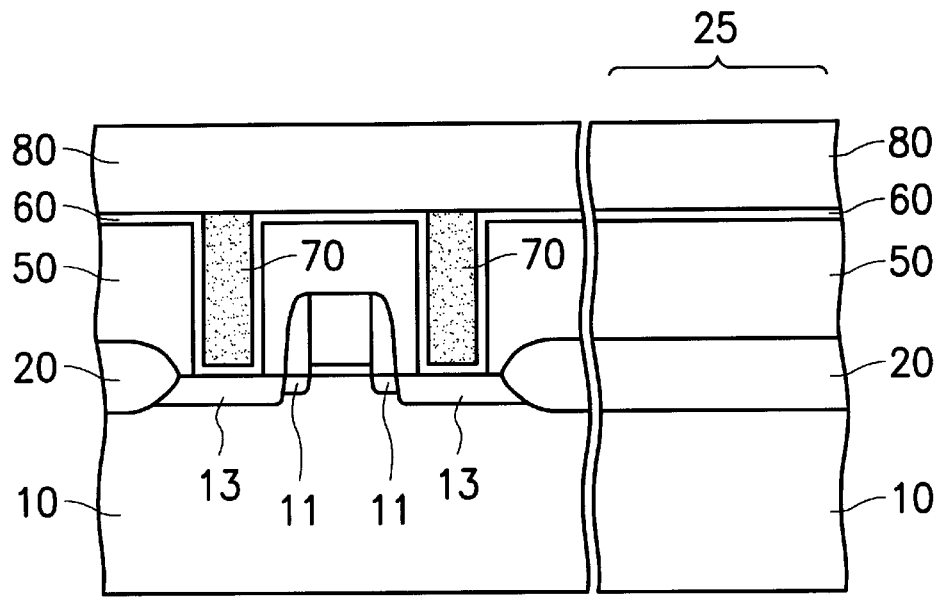
Figure 1G:
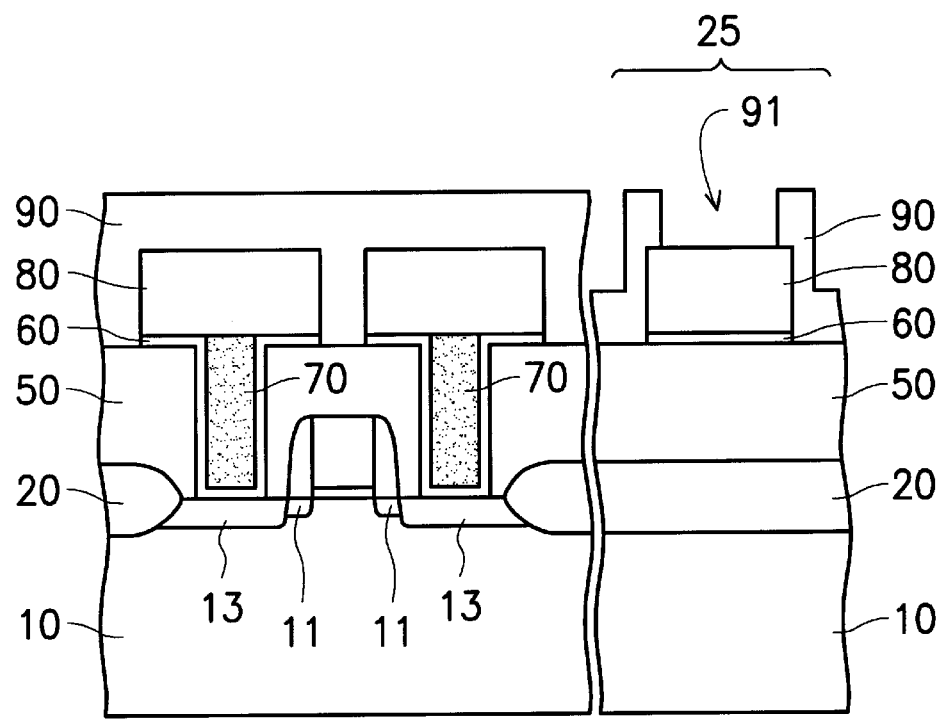
Figure 2A:
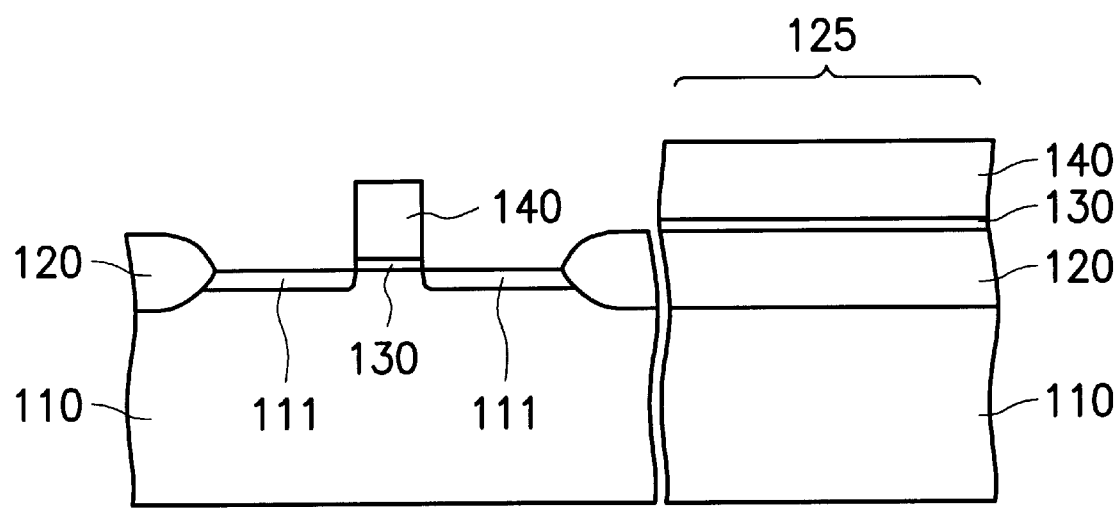
FIG. 2A through FIG. 2F are schematic sectional diagrams depicting the steps involved in a process according to the invention for forming at least a bonding pad on an IC chip.

Referring first to FIG. 2A, the fabrication process for the IC chip has been carried out up to the stage including a silicon substrate 110 on which a field oxide layer 120 (in this case a silicon dioxide layer) is formed. The field oxide layer 120 serves as a first insulating layer in the wafer which defines the active region on the wafer. At least one part or area of the wafer, hereinafter referred to as the "pad area" as indicated by the numeral 125, is reserved for the forming of a bonding pad thereon. The active region part of the wafer as shown on the left in FIG. 2A, on the other hand, is hereinafter referred to as the "active area".

Impurities are diffused into the active area or region so as to adjust the threshold voltage thereof. Further, a gate oxide layer 130 and a polysilicon gate layer 140 are successively formed by deposition and etching on the active region. The gate oxide layer 130 and the polysilicon gate layer 140 in combination constitute a gate. Using the gate (130, 140) as a mask, an ion implantation process is conducted on the wafer so as to diffuse an impurity, such as phosphor ions, into selected parts of the silicon substrate 110, thereby forming a pair of lightly-doped source/drain regions 111 in the silicon substrate 110. Through the foregoing steps, the field oxide layer 120, the gate oxide layer 130, and the polysilicon gate layer 140 are also formed on the pad area 125.

Figure 2B:
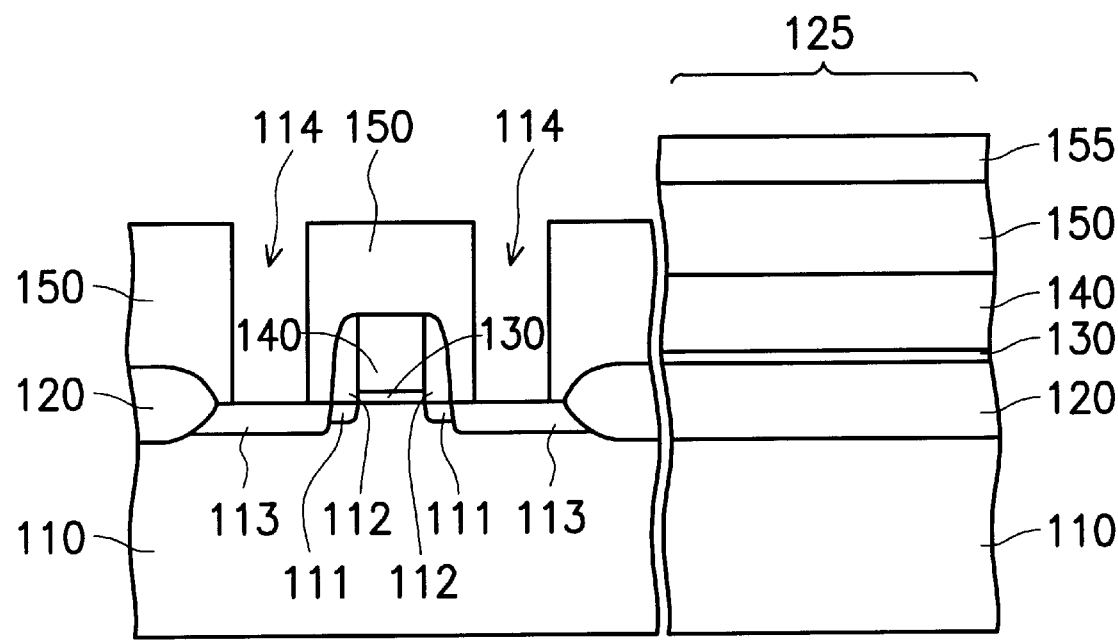

Referring next to FIG. 2B, in the subsequent step, spacer walls 112 are formed on the sidewalls of the gate (130, 140). Using the spacer walls 112 as a mask, an ion implantation process is conducted on the wafer so as to diffuse an impurity, such as arsenic ions, into the silicon substrate 110. As a result of this process, a pair of heavily doped source/drain regions 113 are formed in the silicon substrate 110. Subsequently, a second insulating layer, such as a layer of borophosphosilicate glass (BPSG) 150, is deposited over the entire wafer. Then, anisotropic dry etching is conducted on the wafer with a predefined mask for removal of selected parts of the BPSG layer 150, thereby forming a plurality of metal contact openings 114 through the BPSG layer 150. After that, a third insulating layer, such as a layer of undoped silicon glass (USG) 155, is deposited on the BPSG layer 150.

Figure 2C:
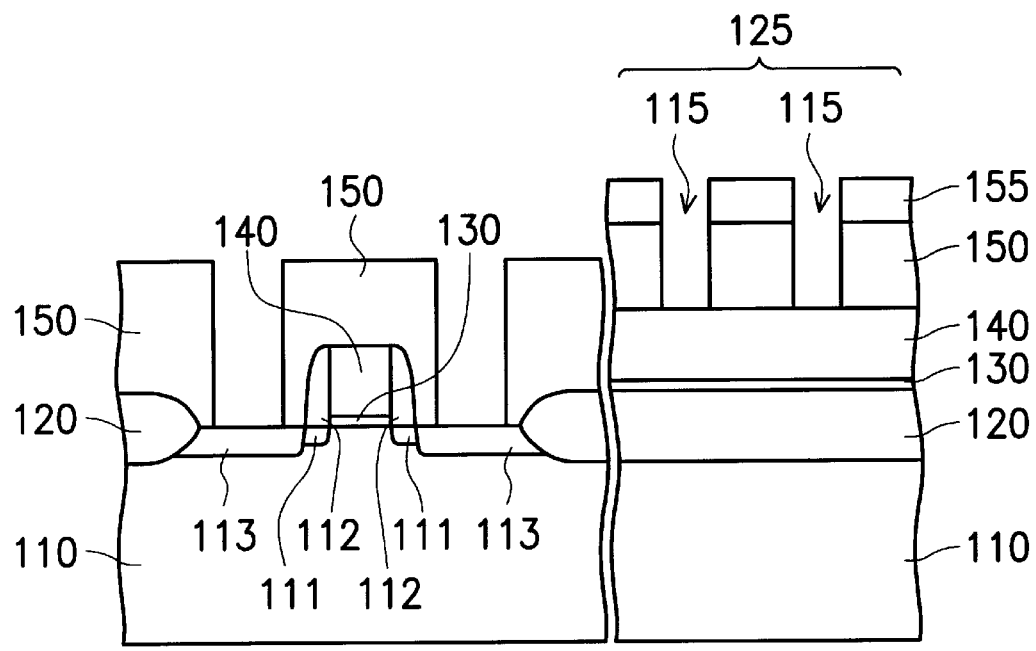
Figure 2D:
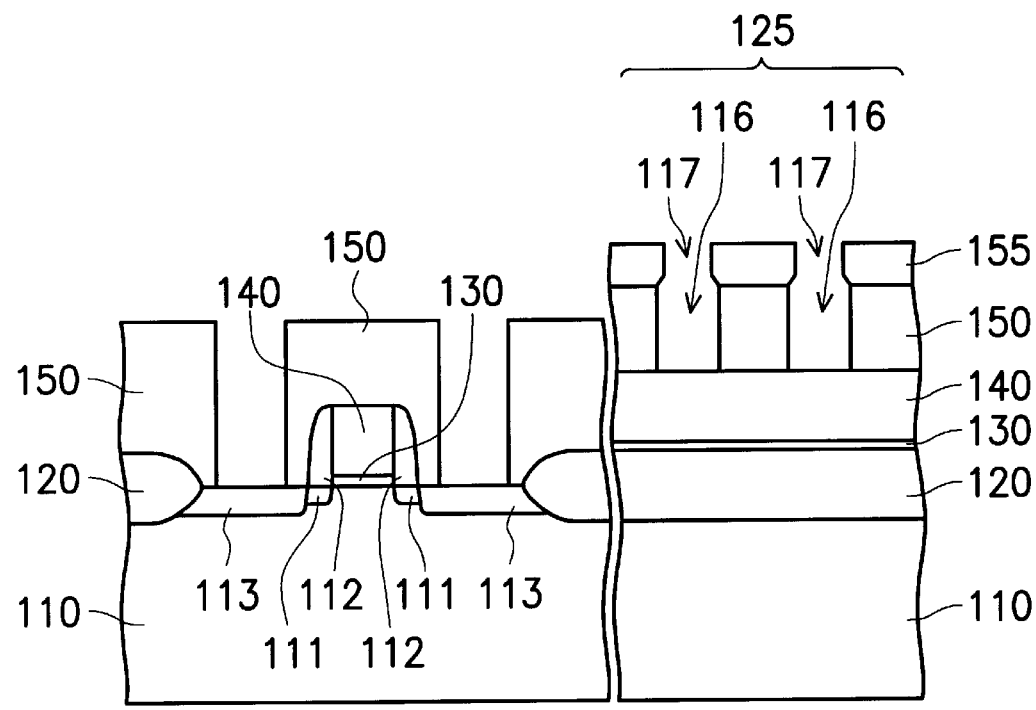

Referring further to FIG. 2C, in the subsequent step, photolithography and anisotropic dry etching are conducted on the wafer to thereby form a plurality of openings 115 through the USG layer 155 and the BPSG layer 150 in the pad area 125. The forming of these openings 115 exposes the underlying polysilicon gate layer 140. Referring next to FIG. 2D, in the subsequent step, wet etching is conducted exclusively on the pad area 125. Since by wet etching the etching rate through the USG layer 155 is slower than that through the BPSG layer 150, each of the plurality of openings 115 will be more etched away on the bottom to form a larger, that is wider, lower or first opening 116 through the BPSG layer 150, and less etched away on the top to form a smaller, that is narrower, upper or second opening 117 through the USG layer 155, as illustrated in FIG. 2D.

Figure 2E:
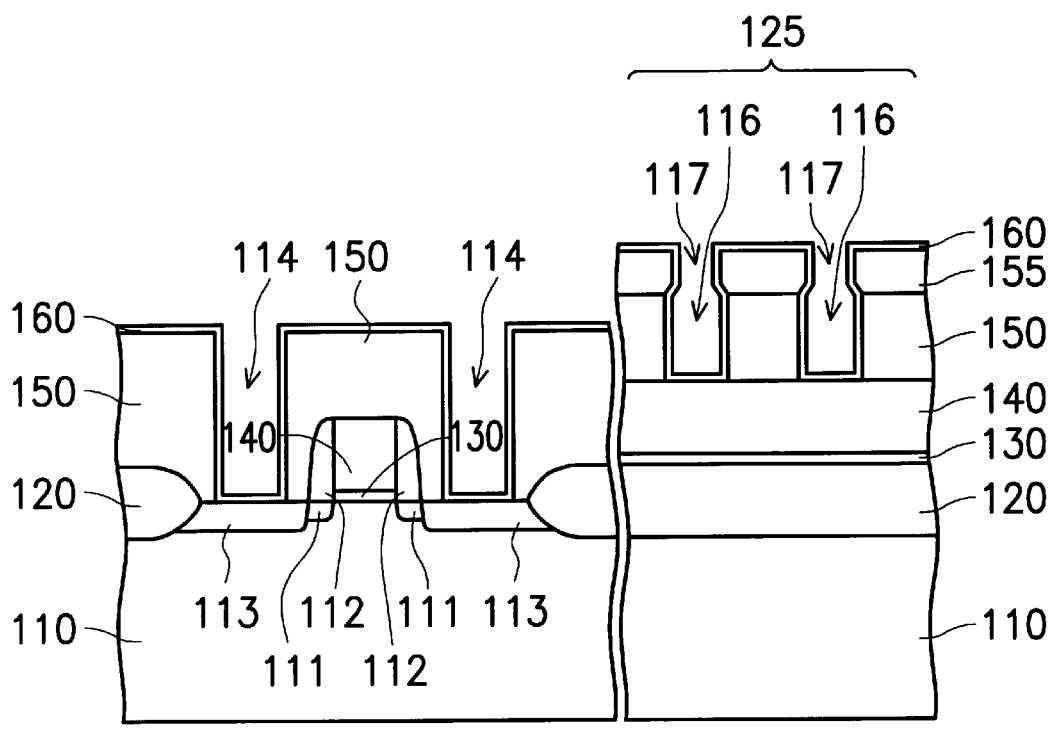

Referring next to FIG. 2E, in the subsequent step, sputtering deposition and rapid thermal processing (RTP) are conducted on the entire wafer so as to form a first metallization layer 160 which is used as a barrier metal layer on the wafer. The first metallization layer 160 is deposited over the entire surface of the wafer, including over the entire inner wall surfaces of the etched openings in the BPSG layer 150 and the metal contact openings 114 in the active area, as well as over the entire inner wall surfaces of the wider or lower and narrower or upper openings 116, 117 in the pad area 125. The first metallization layer 160 is, for example, a layer of titanic compound which is a composition of titanium nitride and titanium silicide ($TiN/TiSi_2$).

Figure 2F:
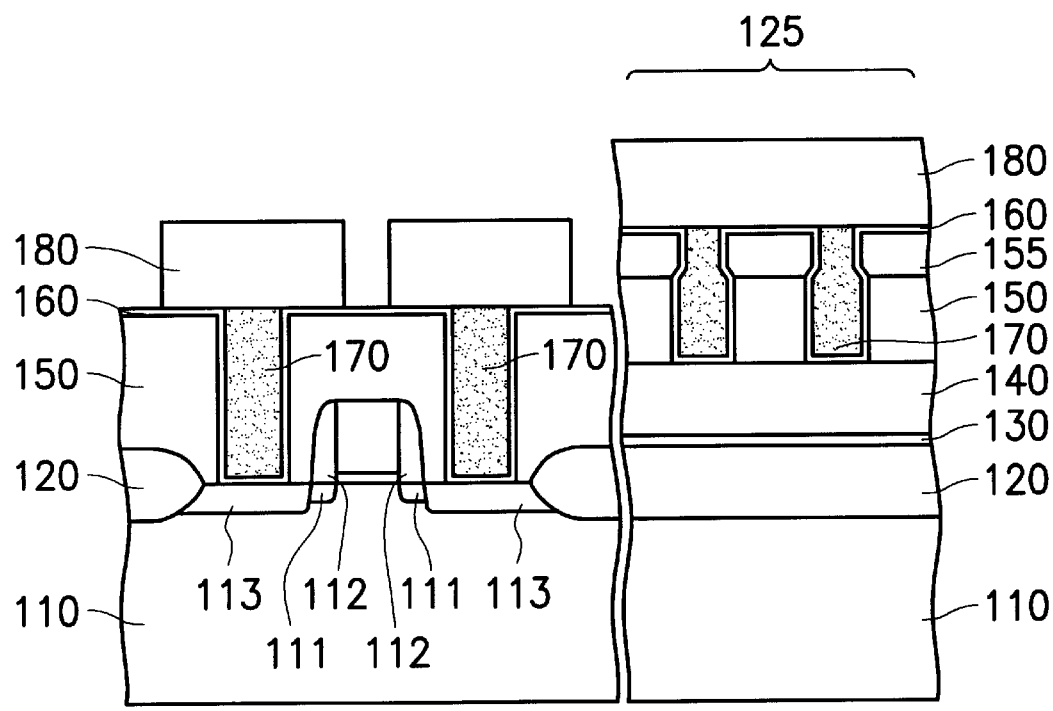

Referring next to FIG. 2F, in the subsequent step, a second metallization layer, such as a layer of tungsten, is deposited over the wafer and fills up the etched openings in the BPSG layer 150 forming the metal contact openings 114 in the active area and wider and narrower openings 116, 117 in the pad area 125 so as to form tungsten plugs 170 therein. The tungsten plugs 170 are formed by first using the chemical-vapor deposition (CVD) method to deposit a layer of tungsten over the titanic compound layer 160 and then conducting a dry etching process on the wafer using the titanic compound layer 160 as an etch end point so as to planarize the surface of titanic compound layer 160 and the tungsten layer. Sputtering deposition is then conducted on the wafer so as to form a third metallization layer 180, such as a layer of an alloy of aluminum and copper or an alloy of aluminum, silicon and copper, over the wafer. Subsequently, a mask and photolithographic process is conducted on the metallization layer 180 so as to define a plurality of connecting wires for the IC chip. A passivation layer (not shown) is then deposited over the wafer for protecting the IC chip. This completes the fabrication of the IC chip in which the metallization layer 180 in the pad area 125 serves as a bonding pad that can electrically connect the IC chip to external pins.

In the pad area 125, the lower part of each of the tungsten plugs 170 is wider than the upper part of each of the tungsten plugs 170, due to the different widths of the wider and narrower openings 116, 117. The wider lower part of the tungsten plugs 170 allows the tungsten plugs 170 to be firmly affixed within the openings 116, 117. Since the overlaying metallization layer 180, which serves as a bonding pad for the IC chip, is bonded to the tungsten plugs 170, the metallization layer 180 is firmly secured by tungsten plugs 170 to the IC chip. Consequently, during assembly of the IC chip in a package, especially by the chip-on-board method, the bonding pad (i.e., the metallization layer 180) cannot easily become detached from the IC chip, thus increasing the assembly yield of good IC packages.

The invention has been described with exemplary preferred embodiments. However, it is to be understood that the scope of the invention is not limited to the disclosed preferred embodiment. To the contrary, it is intended to cover various modifications and similar arrangements. The scope of the claims, therefore, should be accorded the broadest interpretation so as to encompass all such modifications and arrangements.

What is claimed is:

1. A method for forming a bonding pad in a pad area of an IC chip, comprising:
   (1) preparing a substrate on which at least a pad area and an active region are defined;
   (2) forming a first insulating layer in the pad area;
   (3) forming a gate oxide layer over the first insulating layer;
   (4) forming a polysilicon gate layer over the gate oxide layer;
   (5) forming a second insulating layer over the polysilicon gate layer;
   (6) forming a third insulating layer over the second insulating layer in the pad area, wherein after said third insulating layer is formed, the active region is free of the third insulating layer;
   (7) conducting a dry etch process on the third insulating layer and the second insulating layer in sequence in the pad area to form a plurality of first openings through the third insulating layer and a plurality of second openings through the second insulating layer, the first openings being positioned directly above, and being in communication with, the respective second openings in the pad area, wherein the second openings expose the surface of the polysilicon gate layer in the pad area;
   (8) conducting a wet etch process through the first openings and on the second insulating layer to widen the second openings in the pad area, so that the second openings are wider than the corresponding first openings thereabove;
   (9) forming a first conformal metallization layer over the third insulating layer and the entire inner wall surfaces of the first openings and the second openings;
   (10) forming a second metallization layer which fills up the first openings and the second openings, wherein the second metalization layer directly connects with the polysilicon gate layer in the pad area;
   (11) planarizing the second metallization layer and the third insulating layer to form a plug, the plug being firmly affixed within both the second opening and the corresponding first opening;
   (12) forming a third metallization layer over the second metallization layer and the third insulating layer; and
   (13) completing the fabrication of the IC chip in which the third metallization layer in the pad area serves as a bonding pad.

2. A method as claimed in claim 1, wherein the first insulating layer comprises silicon dioxide.

3. A method as claimed in claim 1, wherein the second insulating layer comprises borophosphosilicate glass.

4. A method as claimed in claim 1, wherein the third insulating layer comprises undoped silicon glass.

5. A method as claimed in claim 1, wherein the first metallization layer comprises TiN.

6. A method as claimed in claim 1, wherein the second metallization layer comprises tungsten.

7. A method as claimed in claim 1, wherein the third metallization layer comprises an alloy of aluminum and copper.

8. A method as claimed in claim 1, wherein the plurality of second openings are larger than the plurality of first openings.

9. A method for forming a bonding pad in a pad area of an IC chip, comprising:
   preparing a substrate on which at least a pad area and an active region are defined;
   forming a first insulating layer in the pad area and in the active region;
   forming a gate oxide layer in the active region, and over the first insulating layer in the pad area;
   forming a polysilicon gate layer over the gate oxide layer in the active region and in the pad area;
   forming a second insulating layer over the polysilicon gate layer in the active region and in the pad area;
   performing a first dry etch process to form a plurality of first openings in the second insulating layer in the active region;
   forming a third insulating layer over the second insulating layer in the pad area, wherein after said third insulating layer is formed, the active region is free of the third insulating layer;
   performing a second dry etch process on the third insulating layer and the second insulating layer to form a plurality of second openings exposing the polysilicon gate layer in the pad area;
   performing a wet etch process on the second insulating layer and only in the pad area to widen only a bottom portion of the second openings;
   forming a first conformal metallization layer over the third insulating layer and the entire inner wall surfaces of the first openings and the second openings;
   forming a second metallization layer which fills up the first openings and the second openings;

planarizing the second metallization layer; and forming a third metallization layer over the second metallization layer, wherein the second openings with the widened bottom portion prevent the third metallization layer from detaching from the IC chip.

10. A method for forming a bonding pad in a pad area of an IC chip, consisting of:

forming a first insulating layer in the pad area;

forming a gate oxide layer on the first insulating layer;

forming a polysilicon layer on the gate oxide layer;

forming a second insulating layer on the polysilicon layer;

forming a third insulating layer on the second insulating layer in the pad area;

performing a dry etch process on the third insulating layer and the second insulating layer to form an opening exposing the polysilicon gate layer in the pad area;

performing a wet etch process on the second insulating layer in the opening to widen a bottom portion of the opening, thereby forming the opening to have a bell-shape;

forming a first conformal metalization layer over the third insulating layer and an entire inner wall surface of the bell-shaped opening;

forming a second metalization layer which fills up the bell-shaped opening;

planarizing the second metalization layer to expose the third insulating layer to form a bell-shaped plug; and forming a bonding pad on the second metalization layer, wherein the bell-shaped plug prevents the bonding pad from detaching from the IC chip.

* * * * *